United States Patent [19]
Moore et al.

[11] Patent Number: 5,939,908
[45] Date of Patent: Aug. 17, 1999

[54] DUAL FET DRIVER CIRCUIT

[75] Inventors: Daniel D. Moore, Canton; Gary P. Whelan, South Lyon; Kenneth C. Earl, Brighton, all of Mich.

[73] Assignee: Kelsey-Hayes Company, Livonia, Mich.

[21] Appl. No.: 08/883,715

[22] Filed: Jun. 27, 1997

Related U.S. Application Data

[60] Provisional application No. 60/020,659, Jun. 27, 1996.

[51] Int. Cl.$^6$ ................................................ H03B 1/00
[52] U.S. Cl. .................... 327/108; 327/112; 327/387; 326/21; 326/23
[58] Field of Search .................. 326/21, 23, 26, 326/27, 56, 82; 327/108, 112, 379, 387, 389

[56] References Cited

U.S. PATENT DOCUMENTS

| | | | |
|---|---|---|---|
| 3,641,366 | 2/1972 | Fujimoto | 307/251 |
| 3,806,738 | 4/1974 | Chin et al. | 307/288 |
| 3,816,762 | 6/1974 | Holt, Jr. | 327/313 |
| 4,016,595 | 4/1977 | Compton | 357/43 |
| 4,459,498 | 7/1984 | Stengl et al. | 327/436 |
| 4,658,203 | 4/1987 | Freymuth | 323/282 |
| 4,677,323 | 6/1987 | Marsh | 307/571 |
| 4,808,839 | 2/1989 | Dunn et al. | 307/296.4 |
| 4,871,979 | 10/1989 | Shearer et al. | 330/253 |
| 5,001,373 | 3/1991 | Bator et al. | 327/321 |
| 5,126,692 | 6/1992 | Shearer et al. | 331/8 |

*Primary Examiner*—Tim Callahan
*Assistant Examiner*—An T. Luu
*Attorney, Agent, or Firm*—MacMillan, Sobanski & Todd, LLC

[57] ABSTRACT

A driver circuit for supplying an electric current to a device having a pair of power FET's connected in series between the device and a power supply.

19 Claims, 5 Drawing Sheets

DUAL FET DRIVER CIRCUIT

CROSS REFERENCE TO RELATED APPLICATIONS

This application claims the benefit of U.S. Provisional Application No. 60/020,659, filed Jun. 27, 1996.

BACKGROUND OF THE INVENTION

This invention relates in general to anti-lock brake systems and in particular to a driver circuit having two series connected Field Effect Transistors (FET's).

An Anti-lock Brake System (ABS) is often included as standard or optional equipment on new vehicles. When actuated, the ABS is operative to control the operation of some or all of the vehicle wheel brakes. A typical ABS includes a plurality of solenoid valves mounted within a control valve and connected to the vehicle hydraulic brake system. Usually, a separate hydraulic source, such as a motor driven pump, is included in the ABS for reapplying hydraulic pressure to the controlled wheel brakes during an ABS braking cycle. An ABS further includes an electronic control module which is electrically connected to wheel speed sensors mounted adjacent to the controlled wheels, the solenoid valve coils and the pump motor. The control module can be mounted directly upon the control valve or located remotely therefrom. The control module includes a microprocessor which is programmed to control the ABS in accordance with a control algorithm and permanently stored parameters.

During vehicle operation, the microprocessor in the ABS control module continuously receives speed signals from the wheel speed sensors. The microprocessor monitors the speed signals for potential wheel lock-up conditions. When the vehicle brakes are applied and the microprocessor senses an impending wheel lock-up condition, the microprocessor is responsive thereto to close a fail-safe power relay. The power relay, which can be an electromechanical or solid state device, controls the supply of electric power to enable the solenoid valves and, optionally, the pump motor. Additionally, if the microprocessor detects a malfunction in the ABS, the power relay is opened to deactivate the ABS. The microprocessor then selectively actuates the solenoid valves in the control valve in accordance with the control algorithm to cyclically relieve and reapply hydraulic pressure to the controlled wheel brakes. The hydraulic pressure applied to the controlled wheel brakes is adjusted by the operation of the solenoid valves to limit wheel slippage to a safe level while continuing to produce adequate brake torque to decelerate the vehicle.

Referring now to the figures, there is illustrated in FIG. 1, a schematic drawing of a portion of a typical ABS control module which includes an electromechanical relay 10. The relay includes a relay coil 11 and a set of normally open relay contacts 12. When the relay coil 11 is energized, the relay contacts 12 close. The relay contacts 12 have a first terminal 15 connected to a vehicle power supply, which is shown as a battery in FIG. 1. A second terminal 16 of the relay contacts 12 is connected to a plurality of loads 20, two of which are shown. The loads 20 are typically the coils for the ABS solenoid valves but also can optionally include the pump motor. Each load is connected through a corresponding load driver 21 to a vehicle ground 22. The load drivers 21 will be further described below.

One end of the relay coil 11 is connected through a diode 13 to the vehicle power supply 14. The other end of the relay coil 11 is connected through a relay driver 25 to a relay output port 26 of an ABS microprocessor 27. The relay driver 25 is responsive to the voltage appearing at the relay output port 26 to energize the relay coil 11. As described above, energization of the relay coil 11 closes the relay contacts 12 to supply power to the loads 20.

Each of the load drivers 21 typically includes a power rated Field Effect Transistor (FET) which has a drain terminal (not shown) connected to the corresponding load 20 and a source terminal (not shown) connected to a vehicle ground 22. If the load driver 21 includes a logic level FET, a FET gate terminal (not shown) is connected directly to a corresponding load driver output port 28 on the microprocessor 27. Alternately, a conventional FET driver circuit (not shown) can be included in the load driver 21. The FET driver circuit is connected between the corresponding driver output port 28 and the load driver FET gate terminal. The FET driver circuit is responsive to the logic level voltages which appear at the driver output port 28 to generate a gate voltage which is sufficient to cause the load driver FET to change from its non-conducting state to its conducting state.

A schematic diagram of a typical prior art solid state relay 30 is shown in FIG. 2. Components in FIG. 2 which are similar to components shown in FIG. 1 have the same numerical designations. The solid state relay 30 includes a FET 31 having a source terminal 32 connected to a plurality of loads 20. The solid state relay 30 also includes a diode 35 having a cathode connected to a drain terminal 36 of the FET 31. The diode 35 has an anode connected to the vehicle power supply 14. The diode 35 protects the FET 31 from application of a reverse power supply voltage, which can occur if the vehicle battery is incorrectly connected following vehicle servicing. It is also known to substitute a Shott kLy diode (not shown) for the diode 35 to provide reverse voltage protection.

The FET 31 has a gate terminal 38 connected to a FET gate driver 40. The gate driver 40 is connected to the relay output port 26 of the ABS microprocessor 27. A logic signal, which alternates between ground potential and a "high" voltage, appears at the relay output port 26. Typically, the high voltage is five volts. The FET gate driver 40 is responsive to the logic signal to generate a corresponding gate signal at the FET gate terminal 38. The FET gate driver 40 applies a voltage to the FET gate terminal 38 when the microprocessor relay output port 26 is high. The gate voltage has a sufficient magnitude to cause the FET 31 to be in its conducting state. Because the FET 31 is connected to the high side of the loads 20, the gate driver 40 typically is a commercially available integrated circuit which includes a voltage doubler or charge pump for generating the voltage to be applied to the FET gate terminal 38. Alternately, the FET gate driver 40 will pull the FET gate terminal 38 to ground when the relay output port 26 is at ground. When the gate terminal 38 is at ground, the FET 31 will be in its non-conducting state.

The voltage output level of the vehicle power supply 14 can vary during operation of the vehicle. Accordingly, the FET gate driver 40 includes an overvoltage shut down circuit (not shown). The overvoltage shutdown circuit monitors the voltage at a voltage sensing port 41 which is electrically connected by a line 42 to the high side of the power supply 14. If the supply voltage exceeds a predetermined amount, the overvoltage circuit causes the FET gate driver 40 to shut down, pulling the gate terminal 38 of the FET 31 to ground. This switches the FET 31 to its non-conducting state and blocks current flow through the FET 31, protecting the FET 31 from damage. Additionally, a surge suppresser 45 is connected between the power supply 14 and the vehicle ground 22. The surge suppresser 45 is operative to prevent voltage spikes from damaging the ABS electronic components.

The operation of the driver circuit 30 will now be explained. When the microprocessor relay output port 26 is at ground, the gate driver 40 pulls the gate terminal 38 to ground. When the gate terminal 38 is at ground potential, the FET 31 is in a non-conducting state and blocks any current flow from the power supply 14 to the loads 20. When the microprocessor relay output port 26 goes high, a corresponding voltage is generated by the FET gate driver 40 and applied to the FET gate terminal 38. As explained above, the generated gate voltage is sufficiently high to cause the FET 31 to switch to its conducting state, allowing current to flow from the vehicle power supply 14 to the loads 20.

SUMMARY OF THE INVENTION

This invention relates to a driver circuit having two series connected Field Effect Transistors (FET's).

When the FET 31 in the prior art solid state relay 30 shown in FIG. 2 conducts, a voltage drop occurs across the forward biased diode 35. This reduces the voltage applied to the loads 20, such as the ABS solenoid coils and, optionally, the pump motor. Additionally, power is dissipated within the diode 35, which generates heat. This increases the heat which must be dissipated by the electronic control module. Because the pump motor and solenoid coils can draw relatively large currents, the amount of heat generated by the diode 35 can be large. The electronic control modules are typically sealed to protect the electronic components from an adverse environment. Accordingly, heat build up within the control module is of concern. Thus, it would be desirable to provide a solid state relay with less voltage drop and lower power dissipation.

The present invention contemplates a driver circuit including a first electronic device having a first terminal adapted to be connected to a power supply, a second terminal and a control terminal. The first electronic device is responsive to a first control signal being applied to the control terminal to be in a non-conducting state to block current flow between the first and second terminals. The first electronic device is further responsive to a second control signal being applied to the control terminal to be in a conducting state to allow current flow between the first and second terminals. The driver circuit also includes a second electronic device having a first terminal adapted to be connected to a load, a second terminal connected to the second terminal of the first electronic device and a control terminal. The second electronic device is responsive to the first control signal being applied to the control terminal to be in a non-conducting state to block current flow between the first and second terminals. The second electronic control device is further responsive to a second control signal being applied to the control terminal to be in a conducting state to allow current flow between the first and second terminals.

A control device is electrically coupled to the control terminals of the first and second electronic devices. The control device generates the first and second control signals. Additionally, the control device is adapted to be electrically coupled to a port of a microprocessor and responsive to a signal at the microprocessor port to generate the first and second control signals.

In the preferred embodiment, the first and second electronic devices are field effect transistors with the first terminals being source terminals, the second terminals being drain terminals and the control terminals being gate terminals.

It is further contemplated that the driver circuit can include a voltage limiting device electrically coupled between the source and gate terminals of the first field effect transistor. The voltage limiting device includes a series connected Zener diode and a diode. The Zener diode has a cathode electrically coupled to the source terminal of the first field effect transistor and an anode connected to an anode of the diode. The diode has a cathode connected to the gate terminal of the first field effect transistor. Also, the control device can include a field effect transistor drive circuit having a circuit for generating a gate voltage which is greater than the supply voltage by a sufficient amount to cause the field effect transistors to conduct.

The driver circuit also can include a resistor connected between the diode cathode and the gate terminal of the first field effect transistor. The gate driver circuit includes an over voltage shut down circuit which is connected to the power supply and is responsive to the power supply voltage exceeding a predetermined voltage threshold to cause the second field effect transistor to be in its non-conducting states.

In the preferred embodiment, the driver circuit is included in a vehicle anti-lock brake system controller and the load includes a coil for actuating a solenoid valve.

The present invention also contemplates that the load can be connected directly to the power supply with the driver circuit can be connected between the load and ground.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
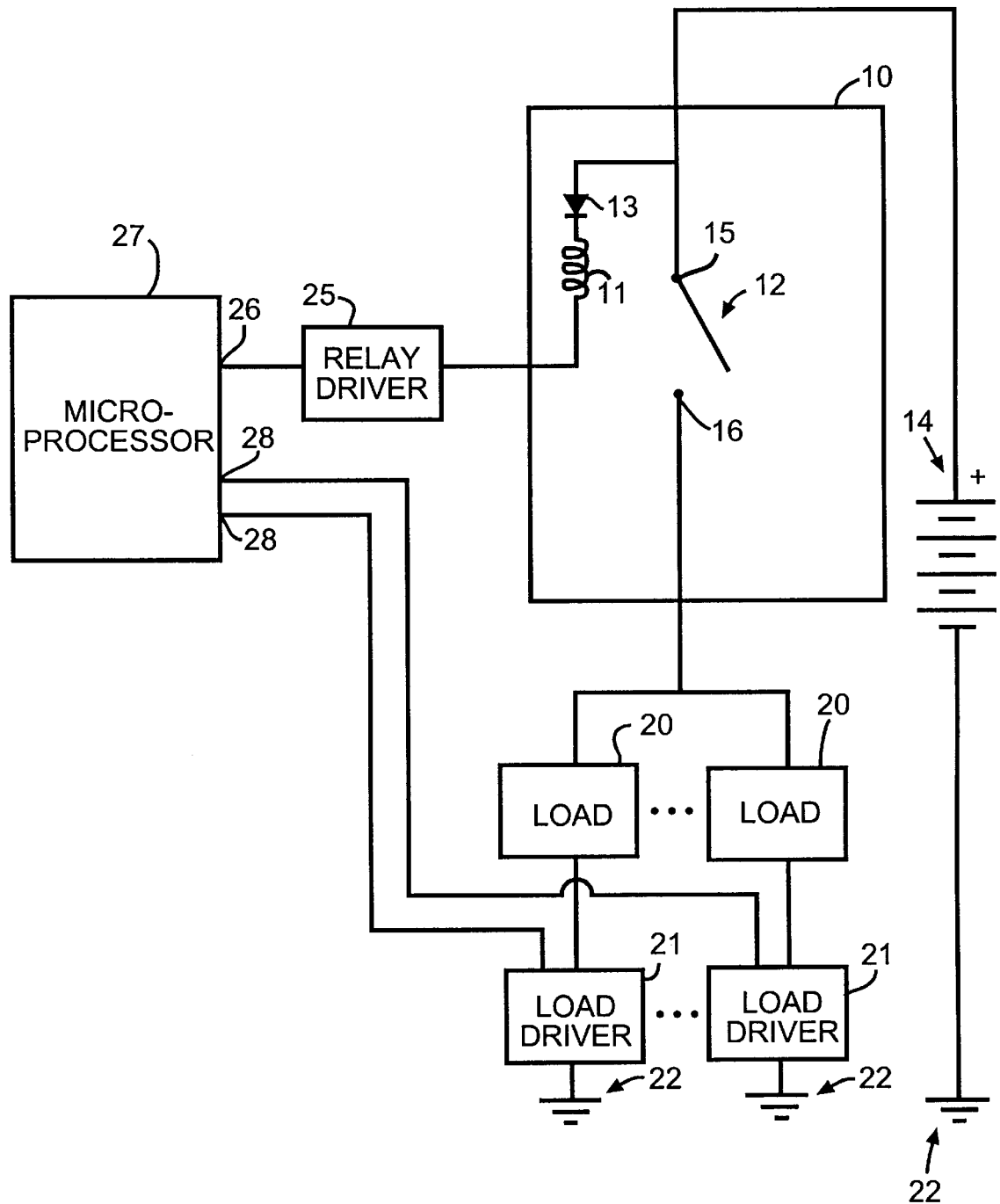
FIG. 1 is a schematic diagram of a prior art FET driver circuit which includes an electromechanical power relay.
Figure 2:
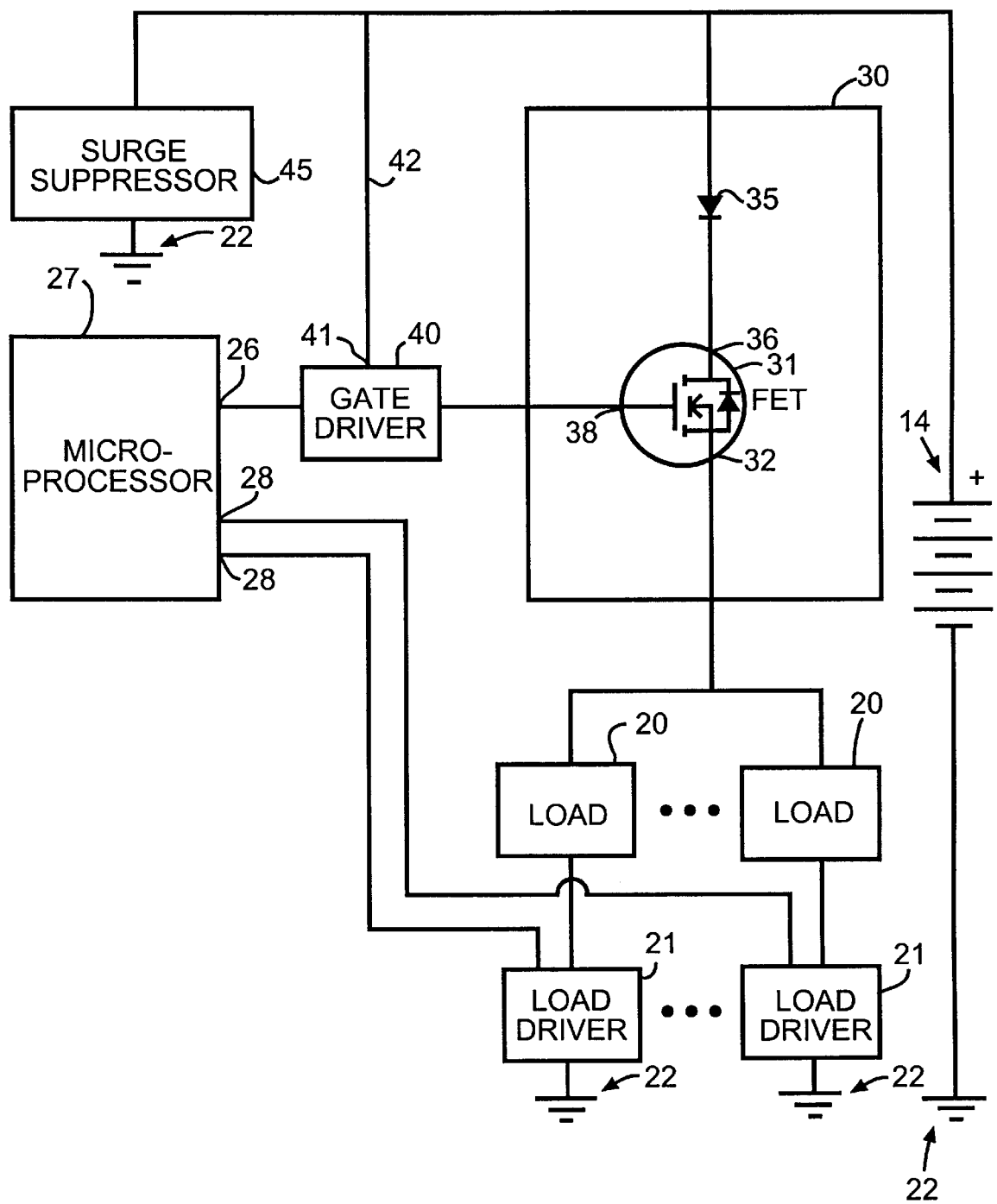
FIG. 2 is a schematic diagram of a prior art FET driver circuit which includes a solid state power relay.
Figure 3:
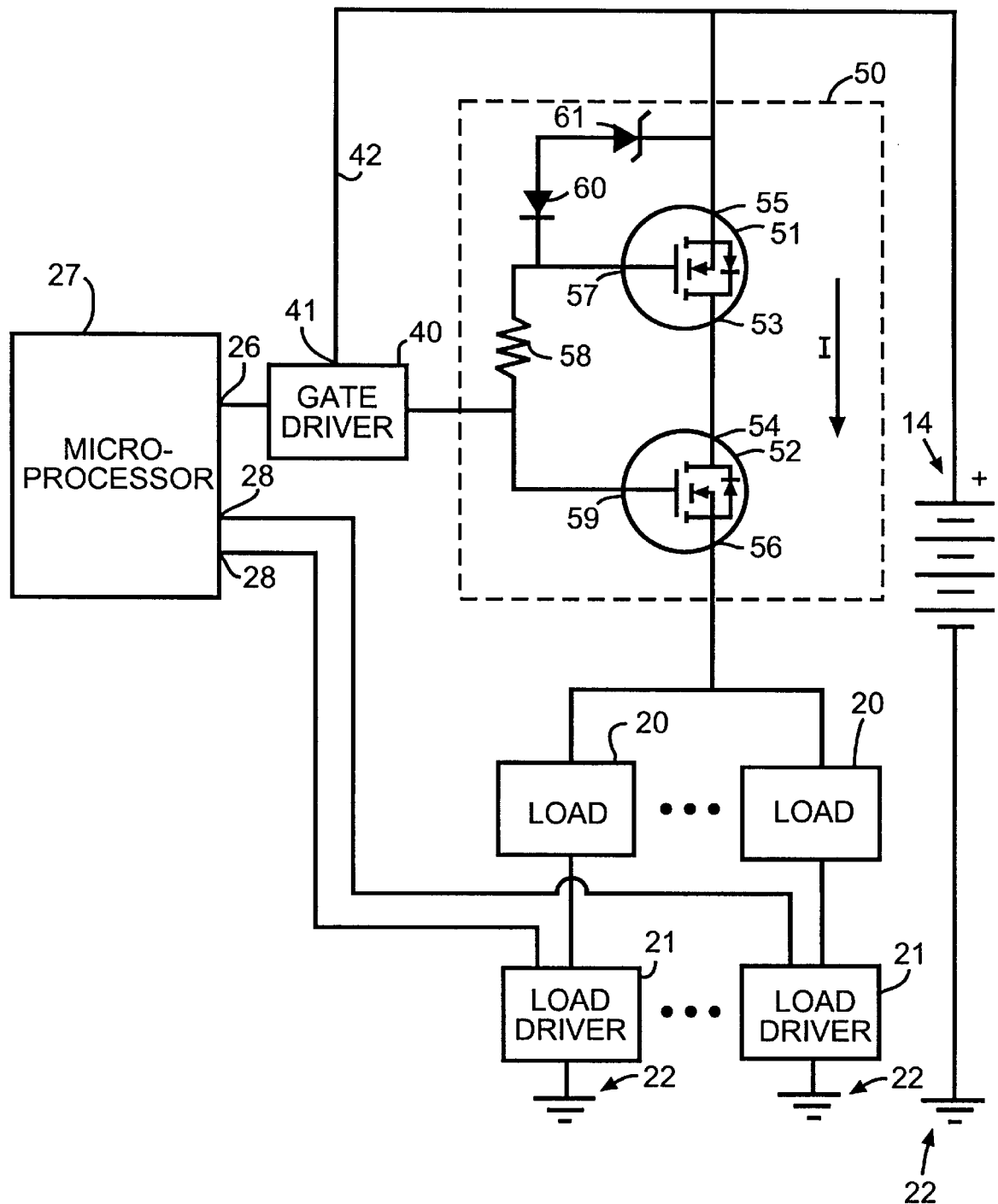
FIG. 3 is a schematic diagram of a dual FET driver circuit in accordance with the present invention.

Referring again to the drawings, there is illustrated in FIG. 3, a dual FET driver circuit 50 in accordance with the invention. Components shown in FIG. 3 which are the similar to components shown in FIGS. 1 and 2 are identified by the same numerical designators.

The dual FET driver circuit 50 includes a first and a second power FET, labeled 51 and 52, respectively. As shown in FIG. 3, the first FET 51 has a drain terminal 53 connected to a drain terminal 54 of the second FET 52. The first FET 52 has a source terminal 55 connected to the vehicle power supply 14 while the second FET 52 has a source terminal 56 connected to one end of the loads 20. The other end of each of the loads 20 is connected through a corresponding load driver 21 to the vehicle ground 22, as was shown in FIGS. 1 and 2.

The first FET 51 has a gate terminal 57 connected through a resistor 58 to the output terminal of the FET gate driver 40. In the preferred embodiment, the resistor 58 has a value of 10K; however, the resistor 58 can have other values which are selected to be compatible with the desired response time for the dual FET driver circuit 50. The second FET 52 has a gate terminal 59 which is connected directly to the output terminal of the FET gate driver 40. As will be explained below, the resistor 58 isolates the FET gate terminals 57 and 59 to allow independent control of the FET's 51 and 52.

For the configuration shown in FIG. 3, the dual FET driver circuit 50 is located on the "high side" of the loads 20. When the FET's 51 and 52 begin conducting, the voltage across the loads 20 increases until it reaches the approximately the value of the power supply voltage. Accordingly, the FET gate driver 40 includes a charge pump (not shown) or a conventional voltage doubler circuit which raises the gate voltage above the load voltage to maintain both FET's 51 and 52 in their conducting states. Typical power FET's require that the FET gate driver 40 generate an output voltage which is at least 10 volts greater than the voltage of the power supply 14. Similar to the circuit shown in FIG. 2, the FET gate driver 40 is connected to the microprocessor relay output port 26.

Additionally, the gate driver 40 includes an overvoltage shut down circuit (not shown) to protect the dual FET driver circuit 50 from large voltages which can be generated during a load loss or switching transient. The overvoltage shutdown circuit monitors the voltage at a voltage sensing port 41 which is electrically connected by a line 42 to the high side of the power supply 14. If the supply voltage exceeds a predetermined amount, which is 28 volts in the preferred embodiment, the overvoltage circuit causes the FET gate driver 40 to shut down, pulling the gate terminal 59 of the second FET 52 to ground. This switches the second FET 52 to its non-conducting state and blocks current flow through both FET's 51 and 52, protecting the FET's from damage. This also allows use of lower power rated FET's in the circuit 50 which might not withstand high currents generated during load loss or switching transients.

The dual FET driver circuit 50 further includes a diode 60 having a cathode connected to the gate terminal 57 of the first FET 51. The diode 60 has an anode connected to an anode of a Zener diode 61. The Zener diode 61 has a cathode connected to the source terminal 55 of the first FET 51. As will be explained below, the diode 60 and Zener diode 61 cooperate with the resistor 58 to provide protection against voltage breakdown between the source and gate terminals 55 and 57 of the first FET 51 during voltage fluctuations caused by load loss or switching transients. It will be appreciated that, for an application having a generally constant voltage supply, the diodes 60 and the Zener diode 61 can be omitted. Accordingly, the diodes 60 and 61 are optional.

Additionally, FETs which include internal electrostatic discharge (ESD) protection can optionally be included (not shown) to protect the driver circuit FETs from internal voltage breakdown between the gate and source terminals or between the gate and drain terminals.

The operation of the dual FET driver circuit 50 will now be explained. When the microprocessor relay output port 26 is at ground, the gate driver 40 pulls the gate terminal 59 of the second FET 52 to ground, causing the second FET 52 to be in its non-conducting state. Because of the resistor 58, the first FET 51 remains in its conducting state. Accordingly, the second FET 52 blocks any current flow from the power supply 14 to the loads 20.

When the microprocessor relay output port 26 goes high, the FET gate driver 40 generates a voltage which approximates the sum of the power supply voltage and the FET threshold voltage. In the preferred embodiment, the generated voltage is approximately 24 volts. The generated FET gate driver voltage is applied to the gate terminals 57 and 58 of both FET's 51 and 52. Because the gate current is small, the voltage drop across the resistor 58 is negligible. The gate voltage causes the FET's 51 and 52 to be in their conducting states, allowing current to flow from the vehicle power supply 14 to the loads 20.

As the current flows through the loads 20, a voltage appears thereacross which is approximately equal to the supply voltage less the combined drain to source voltages of the two FET's 51 and 52. As explained above, the FET gate driver 40 supplies a voltage between the drain and gate terminals of each of the FET's 51 and 52 which is at least 10 volts above the supply voltage. Accordingly, the FET's remain in their conducting state until the microprocessor relay output port 26 returns to ground, thereby causing the FET gate driver 40 to pull the gate 59 of the second FET 52 to ground and switch the second FET 52 back to its non-conducting state.

If an over-voltage condition should develop, the overvoltage shut down circuit included in the gate driver 40 will turn off the second FET 52, as was described above. Additionally, the Zener diode 61 is operative to clamp the magnitude of the voltage between the source terminal 55 and the gate terminal 57 of the first FET 51 to a voltage equal to the sum of the Zener breakdown voltage and the diode forward voltage. The Zener diode 61 is selected to assure that the rated source to gate voltage of the first FET 51 is not exceeded. The remainder of the overvoltage appears across the resistor 58. Thus, the FET's 51 and 52 are protected from being damaged from voltage spikes, which can occur during load loss or switching transients. Accordingly, a separate voltage suppression circuit 45, as shown in the prior art circuit illustrated in FIG. 2, is not needed for the dual FET driver circuit 50.

When the FET gate driver 40 switches the FETs 51 and 52 to their conducting state, both FETs conduct and the total voltage drop across both FETs is less than the combined voltage drops across the diode 35 and the FET 31 shown in the prior art circuit of FIG. 2. Accordingly, the power dissipated by the dual driver circuit 50 shown in FIG. 3 is less than the power dissipated by the prior art single FET driver circuit 30 shown in FIG. 2.

If a reverse voltage is applied to the dual FET driver circuit 50, as would occur if the power supply 14 is incorrectly connected, the internal diode in the first FET 51 will be reverse biased and no current will flow through the FET's or the loads 20. Thus, during normal usage, the dual FET driver circuit 50 provides reverse voltage protection while reducing the power requirement of the circuit and the associated dissipated heat from that of prior art single FET driver circuits.

Figure 4:
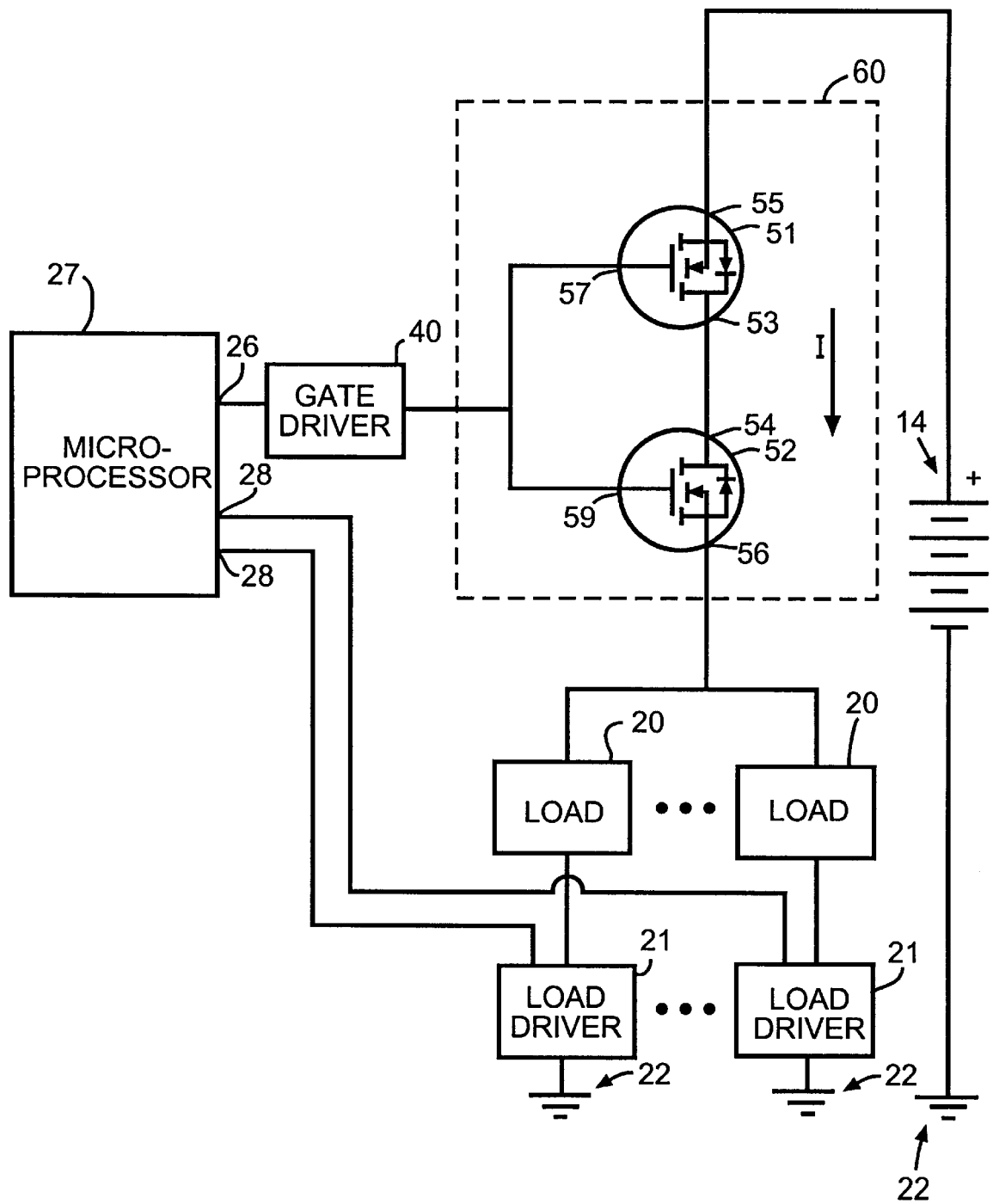
FIG. 4 is an alternate embodiment of the dual FET driver circuit shown in FIG. 2.

An alternate embodiment of the dual FET driver circuit is illustrated at 60 in the schematic diagram shown in FIG. 4. Components in FIG. 4 which are the same as components shown in FIG. 3 have the same numerical designators. The dual FET driver circuit 60 is intended to be used in a situation in which large overvoltage transients are not expected to occur. Accordingly, the resistor 58, the diodes 60 and 61 and the overvoltage protection portion of the gate driver 40 have been omitted from the circuit 60.

When the microprocessor relay output port 26 is at ground, the gate driver 40 pulls both gate terminals 57 and 59 of the FET's 51 and 52 to ground, causing both of the FET's to be in their non-conducting states. Accordingly, the FET's 51 and 52 block any current flow from the power supply 14 to the loads 20. When the microprocessor relay output port 26 goes high, both FET's 51 and 52 are switched to their conducting states.

Figure 5:
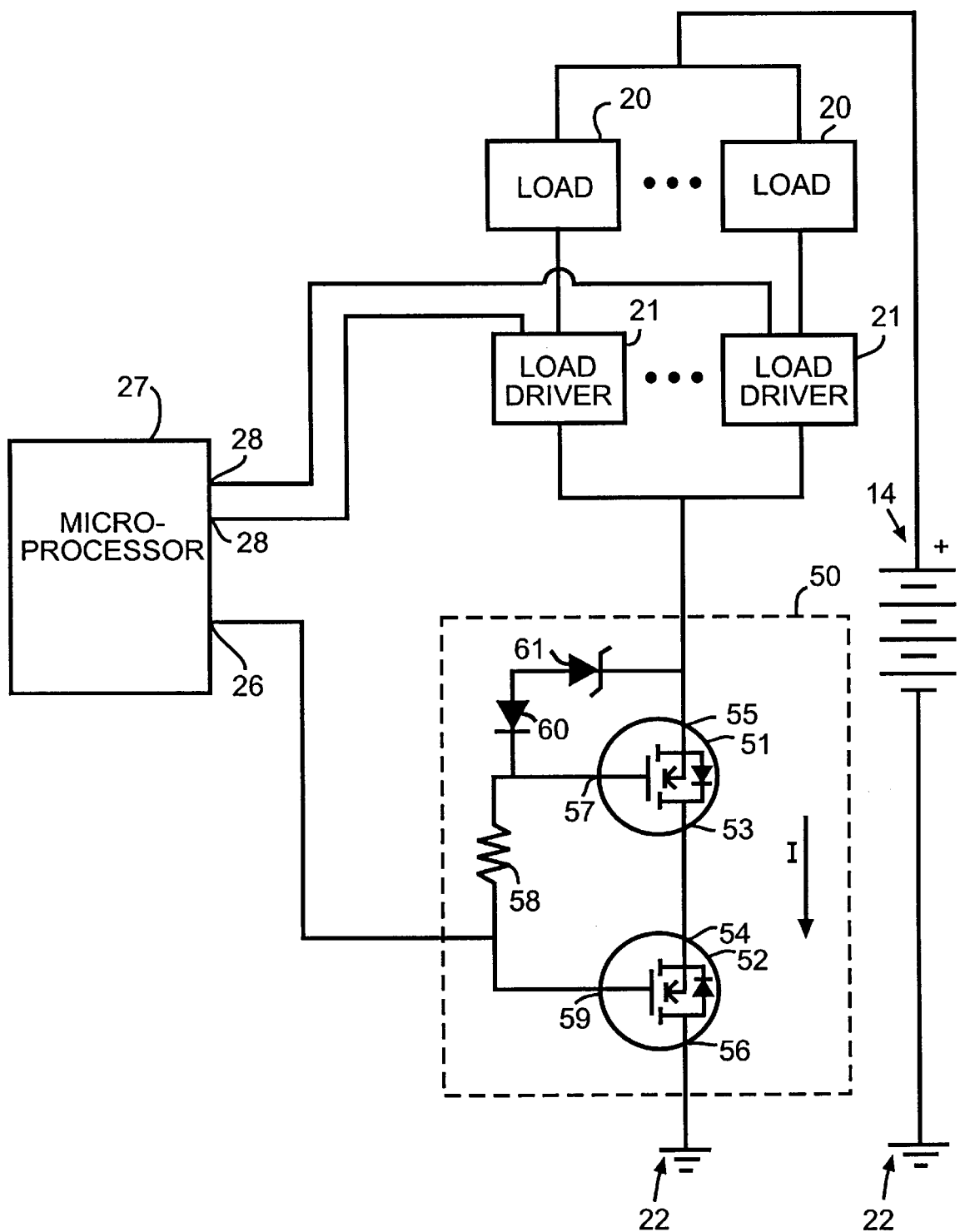
FIG. 5 illustrates the dual FET driver circuit shown in FIG. 2 connected to the low side of the load.

Both dual FET driver circuits 50 and 60 shown in FIGS. 3 and 4, respectively, are connected between the power supply 14 and the loads 20. As described above, this configuration is referred to as a "high side" driver circuit. The present invention also contemplates a "low side" embodiment having the loads 20 connected directly to the power supply 14, as illustrated in FIG. 5. As in the above figures, components in FIG. 5 which are the same as components shown in FIGS. 3 and 4 have the same numerical designators. The low side of each of the loads 20 is connected to a corresponding load driver 21. The dual FET driver circuit 50 is connected between the load drivers 21 and the vehicle ground 22. Each of the load drivers 21 would generate a gate voltage approximately equal to the threshold voltage of the FET included in the load driver plus the voltage drop across the dual FET driver circuit 50.

Because the loads 20 are connected between the dual FET driver circuit 50 and the power supply 14, the voltage at the source terminal 56 of the second FET 52 does not increase as current flows through the loads 20. Accordingly, the dual FET driver circuit 50 can include logic level FET's with gate terminals coupled directly to the microprocessor relay output port 26, as shown in FIG. 5. Thus, the gate driver circuit 40 shown in FIGS. 3 and 4 can be omitted. While the dual FET driver circuit 50 shown in FIG. 3 has been included in FIG. 5, it will be appreciated that the dual FET driver circuit 60 shown in FIG. 4 can also be utilized in the configuration shown in FIG. 5.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. Thus, while the dual FET driver circuit has been described in terms of an anti-lock brake system, it will be appreciated that the dual FET driver circuit can be used in any other applications where reverse current blockage is required to protect a circuit. The example, the dual FET driver circuit can be included in traction control and vehicle stability management systems. Additionally, the features shown in a particular embodiment can be utilized in another embodiment. For example, the resistor 58 shown in FIG. 3, which provides a positive shut off for the driver circuit, can be included in the low side dual FET driver circuit shown in FIG. 5. Furthermore, the dual FET driver circuit can be used as a load driver for controlling the supply of power to a single load component.

What is claimed is:

1. A driver circuit comprising;
   a first electronic device having a first terminal adapted to be connected to a power supply, a second terminal and a control terminal, said first electronic device being responsive to a first control signal applied to said control terminal of said first electronic device to be in a non-conducting state to block current flow between said first and second terminals and being further responsive to a second control signal applied to said control terminal of said first electronic device to be in a conducting state to allow current flow between said first and second terminals; and
   a second electronic device having a first terminal adapted to be connected to a load, a second terminal connected to said second terminal of said first electronic device and a control terminal, said second electronic device being responsive to said first control signal applied to said control terminal of said second electronic device to be in a non-conducting state to block current flow between said first and second terminals and being further responsive to said second control signal applied to said control terminal of said second electronic device to be in a conducting state to allow current flow between said first and second terminals, said first and second electronic devices both being in said conducting state upon application of said second control signal, whereby current flows from said power supply and through both first and second electronic devices to said load.

2. The driver circuit according to claim 1 further including a control device electrically coupled to said control terminals of said first and second electronic devices, said control device generating said first and second control signals.

3. The driver circuit according to claim 2 wherein said control device is adapted to be electrically coupled to a port of a microprocessor and responsive to a signal at said microprocessor port to generate said first and second control signals.

4. The driver circuit according to claim 3 wherein said first and second electronic devices are field effect transistors with said first terminals being source terminals, said second terminals being drain terminals and said control terminals being gate terminals.

5. A driver circuit comprising;
   a first field effect transistor having a first source terminal adapted to be connected to a power supply, a first drain terminal and a first gate terminal, said first field effect transistor being responsive to a first control signal applied to said first gate terminal to be in a non-conducting state to block current flow between said first source and first drain terminals and being further responsive to a second control signal applied to said first gate terminal to be in a conducting state to allow current flow between said first source and first drain terminals;
   a second field effect transistor having a second source terminal adapted to be connected to a load, a second drain terminal connected to said first drain terminal of said first field effect transistor and a second gate terminal, said second field effect transistor being responsive to said first control signal applied to said second gate terminal to be in a non-conducting state to block current flow between said second source and second drain terminals and being further responsive to said second control signal applied to said second gate terminal to be in a conducting state to allow current flow between said second source and second drain terminals;
   a control device electrically coupled to said first and second gate terminals, said control device being adapted to be electrically coupled to a port of a microprocessor and responsive to a signal at said microprocessor port to generate said first and second control signals; and
   a voltage limiting device electrically coupled between said source and gate terminal of said first field effect transistor.

6. The driver circuit according to claim 5 wherein said voltage limiting device includes a Zener diode and a diode, said Zener diode having a cathode electrically coupled to said source terminal of said first field effect transistor, said Zener diode having an anode connected to an anode of said diode, said diode having a cathode connected to said gate terminal of said first field effect transistor.

7. The driver circuit according to claim 6 wherein said source of said first field effect transistor is connected to a power supply which generates an output voltage, and further wherein said control device includes a field effect transistor gate driver circuit, said gate driver circuit including a circuit which generates a voltage at said gate terminals which is greater than said output voltage generated by said power supply and is sufficient to cause said field effect transistors to be in a conducting state.

8. The driver circuit according to claim 7 wherein said the driver circuit is included in an anti-lock brake system controller for a vehicle and further wherein said load includes a coil for actuating a solenoid valve.

9. A driver circuit comprising;
a first electronic device having a first terminal adapted to be connected through a load to a power supply, a second terminal and a control terminal, said first electronic device being responsive to a first control signal applied to said control terminal of said first electronic device to be in a non-conducting state to block current flow between said first and second terminals and being further responsive to a second control signal applied to said control terminal of said first electronic device to be in a conducting state to allow current flow between said first and second terminals; and
a second electronic device having a first terminal adapted to be connected to ground, a second terminal connected to said second terminal of said first electronic device and a control terminal, said second electronic device being responsive to said first control signal applied to said control terminal of said second electronic device to be in a non-conducting state to block current flow between said first and second terminals and being further responsive to said second control signal applied to said control terminal of said second electronic device to be in a conducting state to allow current flow between said first and second terminals, said first and second electronic devices both being in said conducting state upon application of said second control signal, whereby current flows from said power supply and through said load and both first and second electronic devices to said ground.

10. The driver circuit according to claim 9 further including a control device electrically coupled to said control terminals of said first and second electronic devices, said control device generating said first and second control signals.

11. The driver circuit according to claim 10 wherein said first and second electronic devices are field effect transistors with said first terminals being source terminals, said second terminals being drain terminals and said control terminals being gate terminals.

12. A driver circuit comprising;
a first field effect transistor having a first source terminal adapted to be connected through a load to a power supply, a first drain terminal and a first gate terminal, said first field effect transistor being responsive to a first control signal applied to said first gate terminal to be in a non-conducting state to block current flow between said first source and first drain terminals and being further responsive to a second control signal applied to said first gate terminal to be in a conducting state to allow current flow between said first source and first drain terminals;
a second field effect transistor having a second source terminal adapted to be connected to ground, a second drain terminal connected to said first drain terminal of said first field effect transistor and a second gate terminal, said second field effect transistor being responsive to said first control signal applied to said second gate terminal to be in a non-conducting state to block current flow between said second source and second drain terminals and being further responsive to said second control signal applied to said second gate terminal to be in a conducting state to allow current flow between said second source and second drain terminals;
a control device electrically coupled to said first and second gate terminals, said control device generating said first and second control signals; and
a Zener diode having a cathode electrically coupled to said source terminal of said first field effect transistor, said Zener diode having an anode connected to an anode of a diode, said diode having a cathode connected to said gate terminal of said first field effect transistor.

13. A driver circuit comprising:
a first field effect transistor having a first source terminal adapted to be connected to a power supply, said first field effect transistor further having a first drain terminal and a first gate terminal;
a second field effect transistor having a second source terminal adapted to be connected to a load and a second drain terminal connected to said first drain terminal of said first field effect transistor, said second field effect transistor further having a second gate terminal, said second field effect transistor being responsive to a first control signal being applied to said second gate terminal to be in a conducting state and being further responsive to a second control signal being applied to said second gate terminal to be in a non-conducting state;
a Zener diode having an anode and a cathode, said Zener diode cathode connected to said source terminal of said first field effect transistor;
a diode having an anode and a cathode, said diode anode being connected to said Zener diode anode and said diode cathode being connected to said first gate of said first field effect transistor;
a resistor having a first end and a second end, said first end being connected to said first gate of said first field effect transistor and second end being connected to said second gate of said second field effect transistor; and
a control device electrically coupled to said second gate terminal of said second field effect transistor, said control device generating said first and second control signals.

14. The driver circuit according to claim 13 wherein said source of said first field effect transistor is connected to a power supply which generates an output voltage, and further wherein said control device includes a field effect transistor gate driver circuit, said gate driver circuit including a circuit which generates a voltage at said gate terminals which is greater than said power supply output voltage and is sufficient to cause said field effect transistors to be in a conducting state.

15. The driver circuit according to claim 14 wherein said control device is connected to said power supply and is responsive to said power supply voltage exceeding a predetermined value to apply said second control signal to said second gate terminal of said second field effect transistor.

16. The driver circuit according to claim 15 wherein said control device is connected to a port on a microprocessor, said control device being responsive to a signal at said microprocessor port to generate said first and second control signals.

17. The driver circuit according to claim 16 wherein said the driver circuit is included in an anti-lock brake system controller for a vehicle and further wherein said load includes a coil for actuating a solenoid valve.

18. The driver circuit according to claim 17 wherein said power supply generates an output voltage, and further wherein said control device includes a field effect transistor gate driver circuit, said gate driver circuit including a circuit which generates a voltage at said second gate terminal of said second field effect transistor which is greater than said power supply output voltage and is sufficient to cause said second field effect transistor to be in said conducting sate.

19. A driver circuit comprising:
- a first field effect transistor having a first source terminal adapted to be connected through a load to a power supply, said first field effect transistor further having a first drain terminal and a first gate terminal;
- a second field effect transistor having a second source terminal adapted to be connected to a ground and a second drain terminal connected to said first drain terminal of said first field effect transistor, said second field effect transistor further having a second gate terminal, said second field effect transistor being responsive to a first control signal being applied to said second gate terminal to be in a conducting state and being further responsive to a second control signal being applied to said second gate terminal to be in a non-conducting state;
- a Zener diode having an anode and a cathode, said Zener diode cathode connected to said source terminal of said first field effect transistor;
- a diode having an anode and a cathode, said diode anode being connected to said Zener diode anode and said diode cathode being connected to said first gate of said first field effect transistor;
- a resistor having a first end and a second end, said first end being connected to said first gate of said first field effect transistor and second end being connected to said second gate of said second field effect transistor; and
- a control device electrically coupled to said second gate terminal of said second field effect transistor, said control device generating said first and second control signals.

* * * * *